US006895545B2

(12) United States Patent
Parhi

(10) Patent No.: US 6,895,545 B2
(45) Date of Patent: May 17, 2005

(54) SYSTEM AND METHOD FOR GENERATING CYCLIC CODES FOR ERROR CONTROL IN DIGITAL COMMUNICATIONS

(75) Inventor: Keshab K. Parhi, Mission Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 498 days.

(21) Appl. No.: 10/118,038

(22) Filed: Apr. 9, 2002

(65) Prior Publication Data

US 2003/0154436 A1 Aug. 14, 2003

Related U.S. Application Data

(63) Continuation-in-part of application No. 10/055,910, filed on Jan. 28, 2002.

(51) Int. Cl.[7] ........................ H03M 13/15; H03M 13/23
(52) U.S. Cl. ........................ 714/781; 708/492; 714/757
(58) Field of Search ........................ 714/757, 781; 708/492; H03M 13/15, 13/23

(56) References Cited

U.S. PATENT DOCUMENTS 3,703,705 A 11/1972 Patel
5,862,159 A * 1/1999 Seshan ........................ 714/807

FOREIGN PATENT DOCUMENTS

WO 98/07238 2/1998

OTHER PUBLICATIONS

Parhi, K.K.; A systematic approach for design of digit–serial signal processing architectures; Circuits and Systems, IEEE Transactions on , vol.: 38 , Issue: 4 , Apr. 1991 pp.: 358–375.*

Karlsson, M.et al.; A method for increasing the throughput of fixed coefficient digit–serial/parallel multipliers Circuits and Systems, 2004. ISCAS '04. Proceedings of the 2004 International Symposium on , vol.: 2 , May 23–26, 2004 pp.: II–425–428.*

European Search Report issued in EP application No. EP 03 00 7893, mailed Feb. 3, 2004, 4 pages.

Matsushima et al., "Parallel Encoder And Decoder Architecture For Cyclic Codes", *IEICE Transactions On Fundamentals of Electronics, Communications And Computer Sciences, Institute of Electronics*, vol. 79, No. 9, Sep. 9, 1996, pp. 1313–1323.

Albertengo et al., "Parallel CRC Generation", *IEEE Micro*, vol. 10, No. 5, Oct. 1, 1990, pp. 63–71.

Derby, Jeff H., "High–Speed CRC Computation Using State–Space Transformations," *Proceedings of the IEEE Global Telecommunications Conference (GLOBECOM) 2001*, vol. 1: 166–170, IEEE (Nov. 2001).

(Continued)

*Primary Examiner*—R. Stephen Dildine
(74) *Attorney, Agent, or Firm*—Sterne Kessler Goldstein & Fox PLLC

(57) ABSTRACT

A K-bit information signal represented by a polynomial $U(x)$ having a degree K–1 is received. The information signal is transformed to form a transformed information signal using a first transform represented by a polynomial $G_1(x)$ having a degree P. The transformed information signal is represented by a polynomial $T(x)$ having a degree K+P–1. $T(x)$ equals $U(x)G_1(x)$. An initial cyclic code represented by a polynomial $R_1(x)$ is generated for the transformed information signal using a second transform represented by a polynomial $G_2(x)$, where $G_2(x)$ has high-order leading-zero terms. $R_1(x)$ equals the remainder obtained by dividing $T(x)$ by $G_2(x)$. The initial cyclic code is transformed to form a final cyclic code represented by a polynomial $R_2(x)$ using the first transform. $R_2(x)$ equals $R_1(x)/G_1(x)$.

22 Claims, 12 Drawing Sheets

OTHER PUBLICATIONS

Glaise et al., "Fast CRC Calculation," *Proceedings of the 1993 IEEE International Conference on Computer Design: VLSI in Computers and Processors*, pp. 602–605, IEEE (Oct. 1993).

Hobson et al., "A High–Performance CMOS 32–Bit Parallel CRC Engine," *IEEE Journal of Solid–State Circuits* 34(2):233–235, IEEE (Feb. 1999).

Joshi, S.M., et al., "A New Parallel Algorithm for CRC Generation," *Proceedings of IEEE International Conference on Communications* 3:1764–1768, IEEE (Jun. 2000).

Pei, T. and Zukowski, C., "High–Speed Parallel CRC Circuits in VLSI," *IEEE Transactions on Communications* 40(4):653–657, IEEE (Apr. 1992).

Sobski, A. and Albicki, A., "Parallel Encoder, Decoder, Detector, Corrector for Cyclic Redundancy Checking," *Proceedings of IEEE International Symposium on Circuits and Systems (ISCAS)* 6:2945–2948, IEEE (1992).

Parhi, K. and Messerschmitt, D., "Pipeline Interleaving and Parallelism in Recursive Digital Filters—Part I: Pipelining Using Scattered Look–Ahead and Decompositions," *IEEE Transaction on Acoustic, Speech, and Signal Processing* 37(7):1099–1117, IEEE (Jul. 1989).

Parhi, K. and Messerschmidtt, D., "Static Rate–Optimal Scheduling of Interative Data–Flow Programs via Optimum Unfolding," *IEEE Transactions on Computers* 40(2):178–195, IEEE (Feb. 1991).

Parhi, K., "Pipelining in Algorithms with Quantizer Loops," *IEEE Transactions on Circuits and Systems* 38(7):745–754, IEEE (Jul. 1991).

* cited by examiner

SYSTEM AND METHOD FOR GENERATING CYCLIC CODES FOR ERROR CONTROL IN DIGITAL COMMUNICATIONS

CROSS REFERENCE TO RELATED APPLICATIONS

This application is a continuation-in-part of U.S. application Ser. No. 10/055,910, filed Jan. 28, 2002, which in incorporated by reference herein in its entirety.

FIELD OF THE INVENTION

The present invention relates to digital communications. More particularly, the present invention relates to cyclic codes for error control in digital communications.

BACKGROUND OF THE INVENTION

Communicating information via the internet and other digital communications systems has become common in the United States and elsewhere. As the number of people using these communications systems has increased, so has the need for transmitting digital data at ever increasing rates.

Information transmitted by a digital communications system is typically encoded and transmitted as a series of information code words. Encoding is used to improve the overall performance of a digital communications system. In addition to encoding information prior to transmission, many digital communications systems also calculate groups of bits or code words that are appended to a group of information bits prior to transmission. These bits or code words may be used by a signal decoder of a receiver to detect and/or correct bit errors that can occur during transmission. Cyclic Redundancy Check (CRC) bits are an example of bits appended to a group of information bits prior to transmission. These bits are used by a signal decoder to detect and/or correct bit errors.

Typically, the bits and/or code words appended to a group of information bits for transmission form part of a cyclic code or a systematic cyclic code. Cyclic codes or more particularly systematic cyclic codes are often generated using a linear feedback shift register (LFSR) designed to implement a particular generator polynomial or a particular parity polynomial. The generation of a systematic cyclic code typically involves three operations. These operations are: (1) multiplying an information signal, U(x), by $X^{n-k}$; (2) dividing the product $U(x) \cdot X^{n-k}$ by a generator polynomial G(x) to obtain a remainder R(x); and (3) adding R(x) to $U(x) \cdot X^{n-k}$.

Systems and methods for generating cyclic codes exist. These conventional systems and methods, however, have limitations that prevent them from operating at high data rates. In particular, the nested feedback loops of the LFSR used to generate the code words form a speed bottleneck.

Conventional techniques such as look-ahead, pipelining, and parallelism are often used to overcome speed bottlenecks in digital communications systems. These conventional techniques, however, cannot always be applied successfully to design digital communications systems that will operate at a data rate in excess of 2 Gb/s. Applying these conventional techniques is particularly difficult, for example, when dealing with nested feedback loops such as the feedback loops of a linear feedback shift register used to generate the code words of a cyclic code.

There are several approaches, for example, that can be used in applying look-ahead in the context of a circuit having nested feedback loops. Many of these approaches will not, however, improve the performance of the digital circuit to which they are applied, and some of these approaches can even degrade circuit performance or improve the performance in a less-than-linear manner with respect to look-ahead factor. This is due at least in part because look-ahead networks may increase the iteration bound of a circuit. In similar fashion, the application of conventional pipelining and parallelism techniques to nested feedback loops in high speed digital communications systems will not necessarily result in improved performance. Applying these conventional techniques leads to fan-out problems in a high speed digital communications system, and thus they cannot be used to overcome speed bottlenecks caused by nested feedback loops in a high speed digital communications system.

There is a current need for new design techniques and digital logic circuits that can be used to build high-speed digital communication systems. In particular, there is a current need for new systems and methods for generating cyclic codes for error control in digital communication systems that do not create speed bottlenecks and prevent digital communications systems from operating at high data rates.

BRIEF SUMMARY OF THE INVENTION

Systems and methods for generating cyclic codes for error control in digital communications are presented. Generally speaking, the invention operates by receiving an initial group of information bits to be transmitted. This initial group of information bits is operated on to form a transformed group of bits. The transformed group of bits is further operated on to form an initial codeword. This initial codeword is then transformed to form a codeword of a conventional cyclic code and appended to the initial group of information bits.

In an embodiment of the invention, a K-bit information signal represented by a polynomial U(x) having a degree K−1 is received. The information signal is operated on to form a transformed information signal using a first transform represented by a polynomial $G_1(x)$ having a degree P. The transformed information signal is represented by a polynomial T(x) having a degree K+P−1. T(x) equals $U(x)G_1(x)$. An initial cyclic code represented by a polynomial $R_1(x)$ is generated for the transformed information signal using a second transform represented by a polynomial $G_2(x)$. The second transform, $G_2(x)$, has high-order leading-zero terms. $R_1(x)$ equals the remainder obtained by dividing T(x) by $G_2(x)$. The initial cyclic code is transformed to form a final cyclic code represented by a polynomial $R_2(x)$ using the first transform. $R_2(x)$ equals $R_1(x)/G_1(x)$.

The invention can be used to generate the code words of conventional cyclic codes and/or systematic cyclic codes. For example, in an embodiment, the final cyclic code generated is a cyclic redundancy check code. In another embodiment, the final cyclic code generated is a Bose-Chaudhuri-Hocquenghem code. In still another embodiment, the final cyclic code generated is a Reed-Solomon code. The invention can also be used, for example, to generate cyclic Hamming codes, cyclic Golay codes, and maximum-length shift-register codes.

In an embodiment, the transformed information signal is formed by adding the information signal, U(x), to at least one time-shifted copy of the information signal, U(x+t).

In an embodiment, a first linear feedback shift register is used to form the initial cyclic code and a second linear feedback shift register is used to form the final cyclic code.

The final cyclic code is formed by dividing the initial cyclic code, $R_1(x)$, by the first transform, $G_1(x)$.

In an embodiment, the K-bits of the information signal, $U(x)$, are processed in parallel to generate the polynomial, $T(x)$, the initial cyclic code, $R_1(x)$, and the final codeword bits.

Further features and advantages of the present invention, as well as the structure and operation of various embodiments of the present invention, are described in detail below with reference to the accompanying drawings.

BRIEF DESCRIPTION OF THE DRAWINGS/FIGURES

Embodiments of the present invention are described with reference to the accompanying figures. In the figures, like reference numbers indicate identical or functionally similar elements. Additionally, the leftmost digit of a reference number identifies the figure in which the reference number first appears. The accompanying figures, which are incorporated herein and form part of the specification, illustrate the present invention and, together with the description, further serve to explain the principles of the invention and to enable a person skilled in the relevant art to make and use the invention.

DETAILED DESCRIPTION OF THE INVENTION

Modern digital communications systems contain circuits that generate cyclic codes. Generally speaking, cyclic codes are code words (groups of bits), interspersed between groups of information signal bits, that possess a large amount of structure. These code words are used, for example, to decode bits of a received digital information signal and correct transmission errors. Example cyclic codes are Cyclic Redundancy Check (CRC) codes, Bose-Chaudhuri-Hocquenghem (BCH) codes, the Reed-Solomon code, Cyclic Hamming codes, the Cyclic Golay code, and Maximum-Length Shift Register codes.

In the description that follows, example circuits that generate cyclic codes according to the invention and an example method for generating cyclic codes according to the invention are described.

Example Circuits for Generating Cyclic Codes According to the Invention

Figure 1:
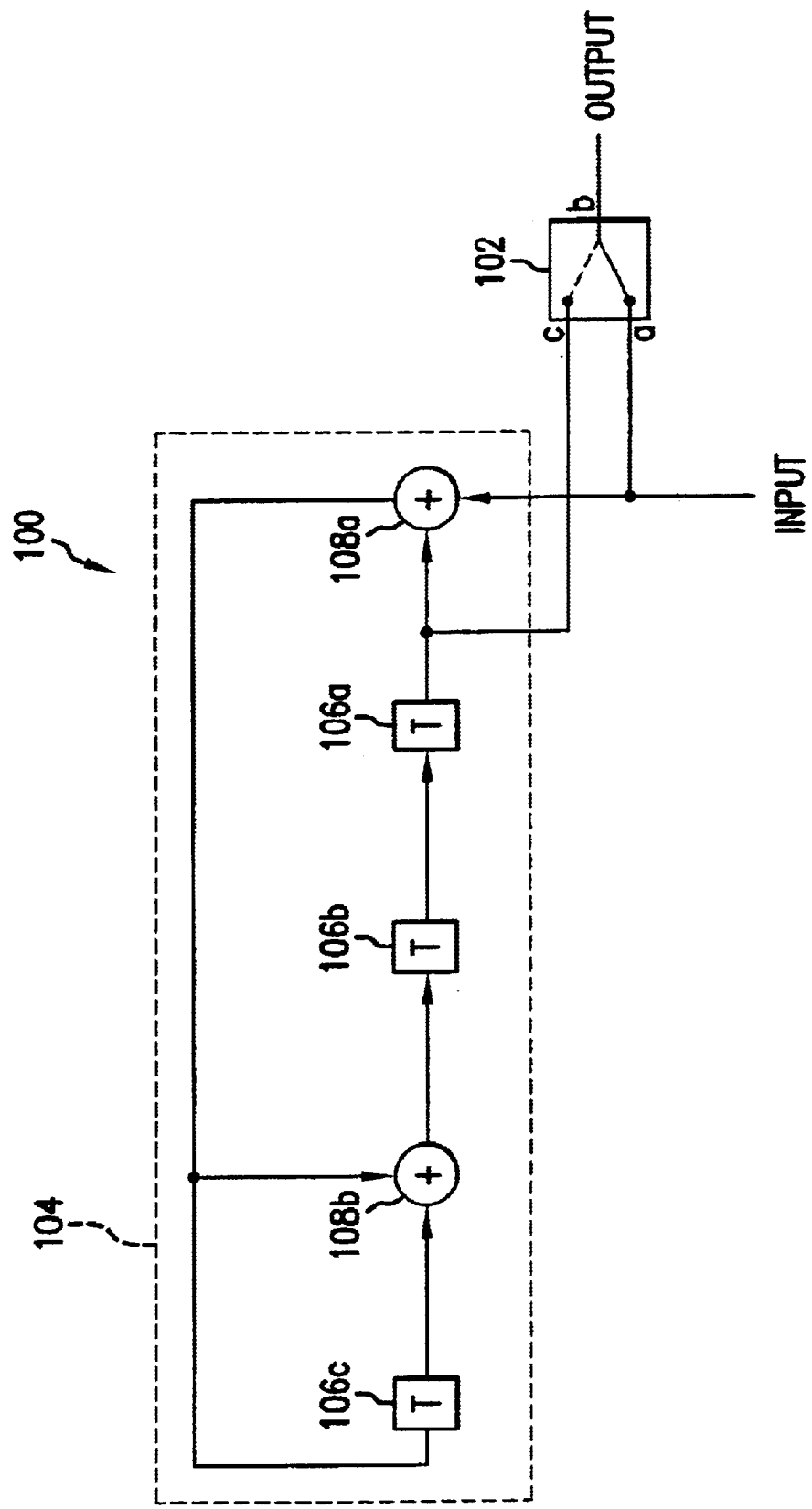
FIG. 1 is a block diagram of an example linear feedback shift-register circuit for generating a cyclic code.

FIG. 1 is a block diagram of a conventional circuit 100 that is used to generate CRC bits. In particular, circuit 100 generates a (7, 4) cyclic code. A (7, 4) cyclic code is a code that appends a three-bit codeword to four information bits thereby forming a group of seven total bits. Circuit 100 is based on the generator polynomial $G(x)=1+X+X^3$. $G(x)$ has one high-order leading-zero term (i.e., the $X^2$ term is equal to zero).

Circuit 100 includes a switch 102 and a linear feedback shift register (LFSR) 104. Switch 102 has three ports (a, b, and c). Switch 102 can be any conventional electronic switch such as, for example, any conventional type of field effect transistors (FET). LFSR 104 has three delay devices 106a, 106b, and 106c. LFSR 104 also has two adders 108a and 108b. Delay devices 106 can be any conventional type of delay device such as, for example, D-flipflops. Adders 108 represent modulo-2 addition and are implemented as exclusive-or circuits. LFSR 104 has two feedback loops. The innermost feedback loop is a nested feedback loop. This innermost nested feedback loop is formed by adders 108a and 108b, delay devices 106b and 106a, and the conductors coupling these devices together.

Circuit 100 has two operating modes. In a first operating mode, a group of CRC bits or a CRC codeword ($R_3, R_2, R_1$) is generated by LFSR 104, wherein $R_1$ is output from delay device 106a, $R_2$ is output from delay device 106b, and $R_3$ is output from delay device 106c. In a second operation mode, the generated CRC codeword is shifted out of LFSR 104 and appended to a group of information bits.

In the first operating mode of circuit 100, the a-port of switch 102 is electrically coupled to the b-port. In this first mode, bits of a digital information signal are input to the a-port of switch 102. During each clock cycle of circuit 100, a bit of the digital information signal is output at the b-port of switch 102. This same bit is also provided to adder 108a. The bit provided to adder 108a is added to an output of delay device 106a to form a resultant bit. This resultant bit is then provided as an input to adder 108b and to delay device 106c of LFSR 104.

To better understand the first operating mode of circuit 100, consider the following example wherein LFSR 104 is used to generate a CRC codeword for a group of four information signal bits (1, 1, 0, 1).

Initially, each of the outputs of the delay devices 106 is a 0 bit (i.e., the codeword ($R_3, R_2, R_1$) of LFSR 104 is (0, 0, 0) before the first of four information signal bits (1, 1, 0, 1) is provided to circuit 100). During a first clock cycle of circuit 100, the first bit of the four bits (1) is provided to the a-port of switch 102 and to adder 108a. The 0 output bit of delay device 106a is added to this first bit (i.e., 1), using modulus-2 addition, to form an output bit equal to one (0+1=1). This output bit (1) is then provided as an input to both delay device 106c and adder 108b. As a result, the output of adder 108b becomes 1 (0+1=1). At the start of the next clock cycle, clock cycle two, the outputs of each of the delay devices 106 are changed to that of their inputs, and the codeword ($R_3$, $R_2$, $R_1$) of LFSR 104 is changed from (0, 0, 0) to (1, 1, 0).

During the second clock cycle, the second bit of the four bits (1) of the input signal is provided to the a-port of switch 102 and to adder 108a. The 0 output bit of delay device 106a is now added to the second bit of the information bits (i.e., 1), using modulus-2 addition, to form a new output bit equal to one (0+1=1). This output bit (1) is then provided as an input to both delay device 106c and adder 108b. As a result, the output of adder 106b now becomes 0 (1+1=0). At the start of the next clock cycle, clock cycle three, the outputs of each of the delay devices 106 is again changed to that of their inputs, and the codeword ($R_3$, $R_2$, $R_1$) of LFSR 104 is changed from (1, 1, 0) to (1, 0, 1).

In a manner similar to that described above, the codeword ($R_3$, $R_2$, $R_1$) of LFSR 104 is changed from (1, 0, 1) to (1, 0, 0) at the start of the fourth clock cycle and from (1, 0, 0) to (1, 0, 0) at the start of the fifth clock cycle. Thus, during the transmission of the four information bits (1, 1, 0, 1), circuit 100 has generated a three-bit CRC codeword (1, 0, 0). This is summarized below in Table 1.

TABLE 1

| CLK Cycle | Input Bit | Output Bits | | |
|---|---|---|---|---|
| | | Delay Device 106c | Delay Device 106b | Delay Device 106a |
| 1 | 1 | 0 | 0 | 0 |
| 2 | 1 | 1 | 1 | 0 |
| 3 | 0 | 1 | 0 | 1 |
| 4 | 1 | 1 | 0 | 0 |
| | | 1 | 0 | 0 |

Figure 3:
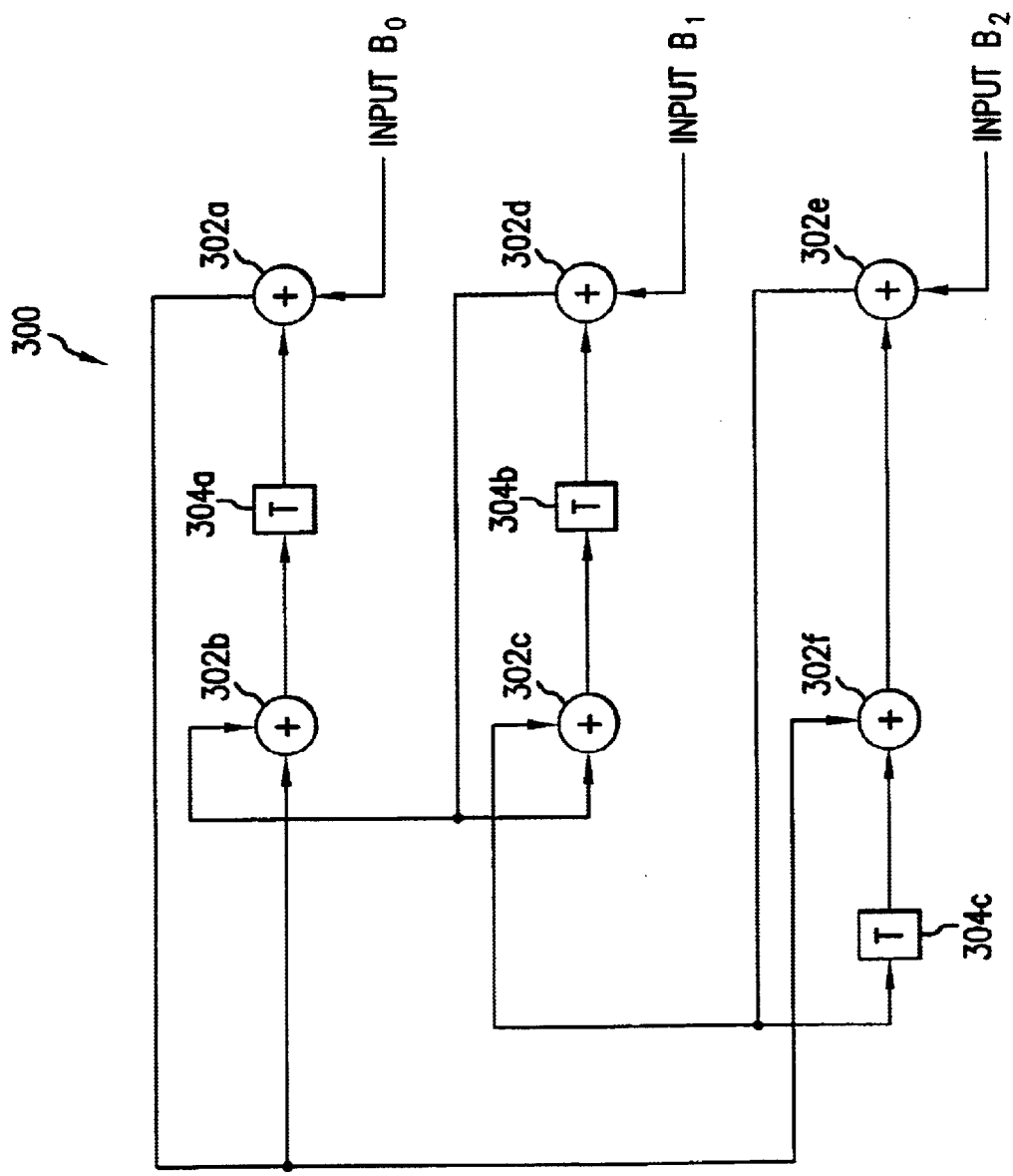
FIG. 3 is a block diagram of an example three parallel paths circuit, which is obtained by unfolding the circuit of FIG. 1 by a factor of three.

The settling time of circuit 100 is equal to the settling time of two adders 108 (i.e., $2T_{adder}$). This can be seen by noting that the output of adder 108b is dependent on the output of adder 108a. As illustrated by the circuit of FIG. 3, conventional unfolding techniques can increase this settling time of parallel CRC circuits since the critical paths of the unfolded circuits are typically longer than the sequential ones.

In the second operating mode of circuit 100, the c-port rather than the a-port of switch 102 is electrically coupled to the b-port. In this second operating mode, during each clock cycle of circuit 100, a bit of a codeword generated by LFSR 104 is output at the b-port of switch 102. Thus, by switching between the two modes of operation, circuit 100 can be used to both generate CRC code words and append these code words to groups of bits of an information signal. For example, by switching to the second operating mode, the codeword (1, 0, 0) calculated during the transmission of the four information bits (1, 1, 0, 1) can be appended to the four information bits to form seven transmission bits (1, 1, 0, 1, 1, 0, 0).

As shown in FIG. 1, LFSR 104 includes two feedback loops. These feedback loops limit the rate at which data can be processed by circuit 100. Circuit 100 cannot be clocked any faster than the settling time of the slowest feedback loop.

Unfolding is a technique for increasing the processing speed of certain digital circuits. Unfolding involves the formation of parallel processing paths. However, as described herein, conventional unfolding techniques can cause fan-out problems and increased circuit settling times. For this reason, conventional unfolding techniques cannot be used to design high speed digital communication systems, particularly systems intended to operate at a data rate in excess of 2 Gb/s.

Figure 2:
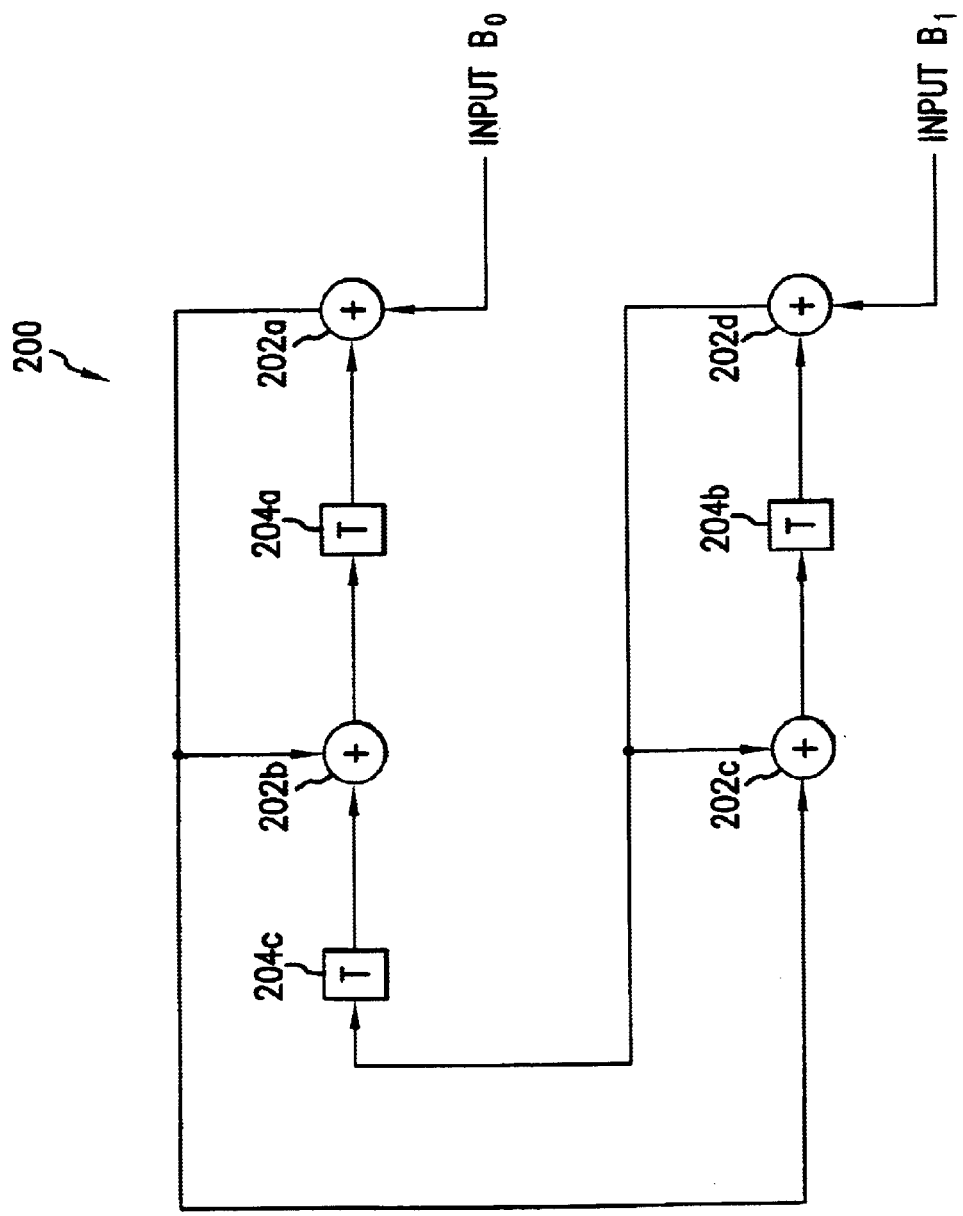
FIG. 2 is a block diagram of an example two parallel paths circuit for generating a cyclic code, which is obtained by unfolding the circuit of FIG. 1 by a factor of two.

FIG. 2 is a block diagram of a two parallel paths circuit 200 obtained by unfolding the LFSR 104 of circuit 100. As shown in FIG. 2, circuit 200 has four adders 202a, 202b, 202c, and 202d and three delay devices 204a, 204b, and 204c. Circuit 200 can be used in lieu of LFSR 104 of circuit 100 to generate the code words of a (7, 4) CRC code.

Circuit 200 generates a group of CRC bits or a CRC codeword ($R_3$, $R_2$, $R_1$), wherein $R_1$ is output from delay device 204a, $R_2$ is output from delay device 204b, and $R_3$ is output from delay device 204c. The iteration bound (settling time) of circuit 200 is equal to the settling time of two adders 202 (i.e., $2T_{adder}$). This is due, for example, to the fact that the output of adder 202b is dependent on the output of adder 202a. Circuit 200 operates in a manner similar to that of circuit 100 except that two information bits are provided to circuit 200, rather than the one information of circuit 100, during each clock cycle of circuit 200.

In order to better understand the operation of circuit 200, consider the following example wherein circuit 200 is used to generate a CRC codeword for a group of four information signal bits (1, 1, 0, 1). These are the same four information signal bits used above to illustrate the operation of LFSR 104.

Initially, each of the outputs of the delay devices 204 is a 0 bit (i.e., the codeword ($R_3$, $R_2$, $R_1$) of circuit 200 is (0, 0, 0) before the first of four information signal bits (1, 1, 0, 1) is provided to circuit 200). During a first clock cycle of circuit 200, the first bit of the four bits (1) is provided to adder 202a and the second bit of the four bits (1) is provided to adder 202d. The input to adder 202a is referred to as input $B_0$. The 0 output bit of delay device 204a is added to this first information signal bit (i.e., 1), using modulus-2 addition, to form an output bit equal to one (0+1=1). This output bit (1) is then provided as an input to both adder 202b and adder 202c. As a result, the output of adder 202b becomes 1 (0+1=1).

During this same clock period, the second bit of the information signal (1) is provided as an input to adder 202d. This input to circuit 200 is referred to as input $B_1$. The output of delay device 204b is then added to this second information signal bit (i.e., 1) to form an output bit equal to 1 (0+1=1). This output bit is provided as an input bit to adder 202c and delay device 204c. As a result, adder 202c forms an output bit equal to 0 (1+1=0). At the start of the next clock cycle, clock cycle two, the outputs of each of the delay devices 204 are changed to that of their inputs, and the codeword ($R_3$, $R_2$, $R_1$) of circuit 200 is changed from (0, 0, 0) to (1, 0, 1).

During the second clock cycle of circuit 200, the third bit of the four information bits (0) is provided to adder 202a. The 1 output bit of delay device 204a is added to this third information signal bit (i.e., 3) to form an output bit equal to one (1+0=1). This output bit (1) is then provided as an input to both adder 202b and adder 202c. As a result, the output of adder 202b becomes 0 (1+1=0). During this same clock period, the fourth bit of the information signal (1) is provided as an input to adder 202d. The output of delay device 204b is then added to this fourth information signal bit (i.e., 1) to form an output bit equal to 1(0+1=1). This output bit is provided as an input bit to adder 202c and delay device 204c. As a result, adder 202c forms an output bit equal to 0 (1+1=0). At the start of the next clock cycle, clock cycle three, the outputs of each of the delay devices 204 is changed to that of their inputs, and the codeword ($R_3$, $R_2$, $R_1$) of circuit 200 is changed from (1, 0, 1) to (1, 0, 0). This is summarized below in Table 2.

TABLE 2

| | | | Output Bits | | |
|---|---|---|---|---|---|
| CLK | Input Bits | | Delay Device | Delay Device | Delay Device |
| Cycle | Input $B_0$ | Input $B_1$ | 204c | 204b | 204a |
| 1 | 1 | 1 | 0 | 0 | 0 |
| 2 | 0 | 1 | 1 | 0 | 1 |
| | | | 1 | 0 | 0 |

As can be seen from the above example, circuit 200 generates the same codeword in two clock cycles as LFSR 104 generates in four clock cycles. The CRC code words generated by circuit 200 are appended to four information signal bits for transmission in a manner similar to that described above with regard to circuit 100.

Theoretically, the circuit of FIG. 1 can be further unfolded in an attempt to further reduce processing time. As illustrated by the circuit of FIG. 3, however, further unfolding using conventional unfolding techniques can lead to increased circuit settling times and/or an inability to generate desired results.

FIG. 3 is a block diagram of a three parallel paths circuit 300 obtained by unfolding the LFSR 104 of circuit 100. As shown in FIG. 3, circuit 300 has six adders 302a, 302b, 302c, 302d, 302e, and 302f and three delay devices 304a, 304b, and 304c. Circuit 300 operates in a manner similar to that described above for circuit 200, and generates the codeword in two cycles. However, due to the increased unfolding, the setting time of the circuit is now equal to the settling time of four adders 302 (i.e., $4T_{adder}$), which is double the setting time of circuit 200. This can be seen by noting that the output of adder 302c is dependent on the outputs of adders 302a, 302f, and 302e. This limitation of conventional unfolding, however, is overcome by the present invention as illustrated by the circuits of FIG. 4 and FIG. 5

Figure 4:
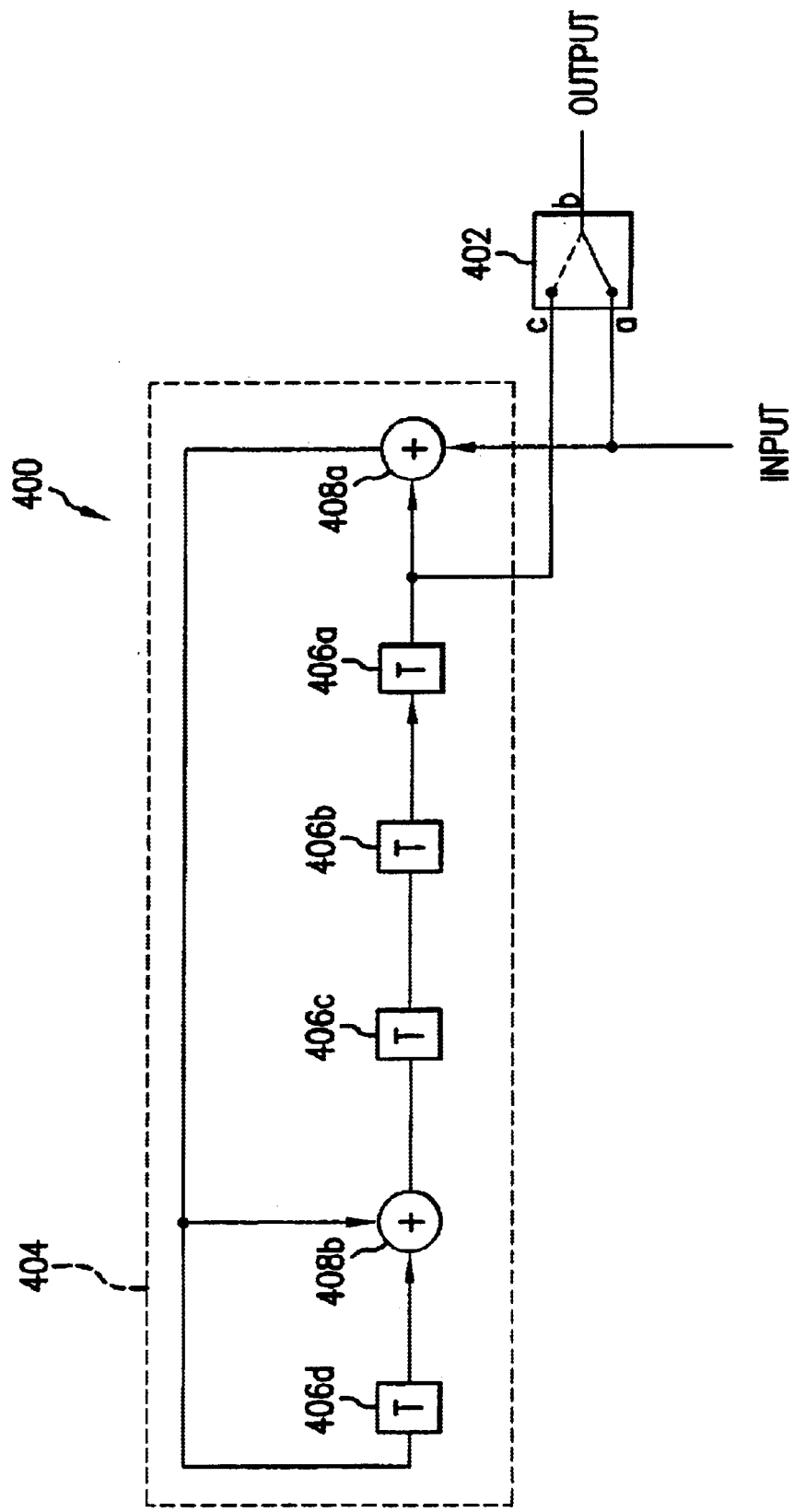
FIG. 4 is a block diagram of an example circuit that is obtained by adding an additional time delay to the innermost nested loop of the circuit of FIG. 1 in accordance with the invention.
Figure 5:
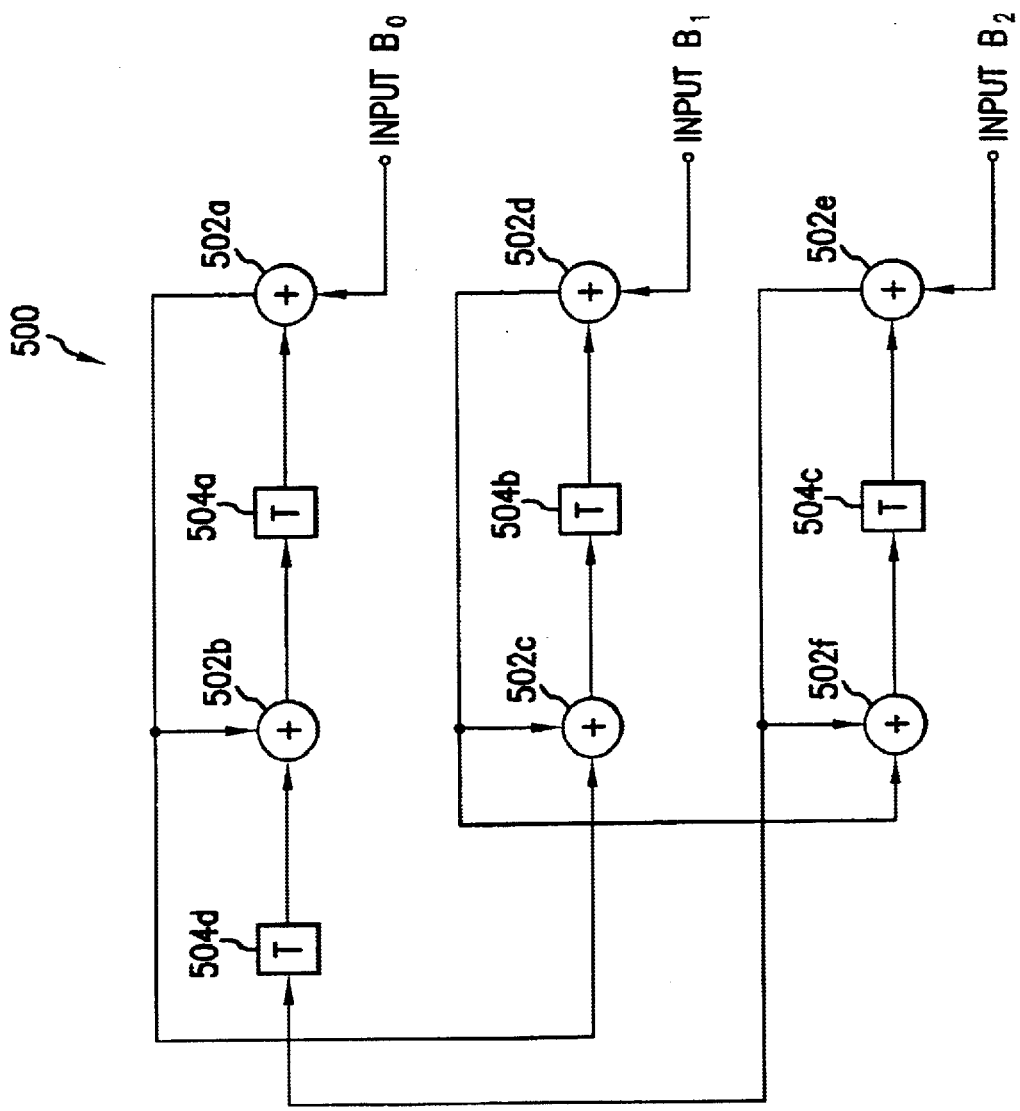
FIG. 5 is a block diagram of an example three parallel paths circuit, which is obtained by unfolding the circuit of FIG. 4 by a factor of three in accordance with the invention.

FIG. 4 is a block diagram of a circuit 400 obtained by adding an additional time delay to the innermost nested feedback loop of the circuit 100 in accordance with the invention. Adding one or more additional time delays to the innermost nested feedback loop of a circuit prior to unfolding is a technique of the present invention. Typically, the number of time delays added to the innermost nested feedback loop of a circuit is selected to make the total number of time delays in the innermost nested feedback loop divisible by a desired unfolding factor. For example, a circuit that is to be unfolded by a factor of three would typically have 3, 6, 9, etc., time delays. This technique of the invention is further described below. Adding one or more additional delays to the innermost nested feedback loop of a circuit prior to circuit unfolding allows the present invention to overcome the increased circuit settling time limitations associated with conventional unfolding techniques.

Circuit 400 includes a switch 402 and a linear feedback shift register (LFSR) 404. Switch 402 has three ports (a, b, and c). LFSR 404 has four delay devices 406a, 406b, 406c, and 406d. LFSR 404 also has two adders 408a and 408b. The innermost nested feedback loop of LFSR 404 is formed by adder 408a, adder 408b, delay devices 406c, 406b and 406a, and the conductors coupling these devices together.

Circuit 400 operates in a manner similar to that described above for circuit 100. Circuit 400 can be represented by a polynomial $P(x)=1+X+X^4$. $P(x)$ has two high-order leading-zero term (i.e., the $X^2$ and the $X^3$ terms are equal to zero).

The settling time of circuit 400 before unfolding is equal to the settling time of two adders 408 (i.e., $2T_{adder}$). This can be seen by noting that the output of adder 408b is dependent on the output of adder 408a.

FIG. 5 is a block diagram of a three parallel paths circuit 500 obtained by unfolding the LFSR 404 of circuit 400 in accordance with the invention. As shown in FIG. 5, circuit 500 has six adders 502a, 502b, 502c, 502d, 502e, and 502f and four delay devices 504a, 504b, 504c, and 504d.

Circuit 500 is similar to that described above for circuit 300. However, the settling time of circuit 500 is equal to the settling time of two adders 502 (i.e., $2T_{adder}$), which is the same as the setting time of circuit 400. Thus, as illustrated by FIG. 5, the unfolding technique of the invention overcomes the limitations of conventional unfolding techniques.

The unfolding technique of the invention is not limited by the example circuits illustrated herein. For example, two additional time delays can be added to the innermost nested feedback loop of LFSR 104 such that each delay device 106a and 106b is effectively a 2T delay device. In this instance, if LFSR 104 is unfolded to form two parallel paths, each of the delay devices 204a and 204b in circuit 200 would become a 2T delay device. In embodiments of the invention additional time delays are added to the innermost nested feedback loop of LFSR 104 to permit increased unfolding in accordance with the invention and thereby increase the rate at which cyclic code words can be generated.

Figure 6A:
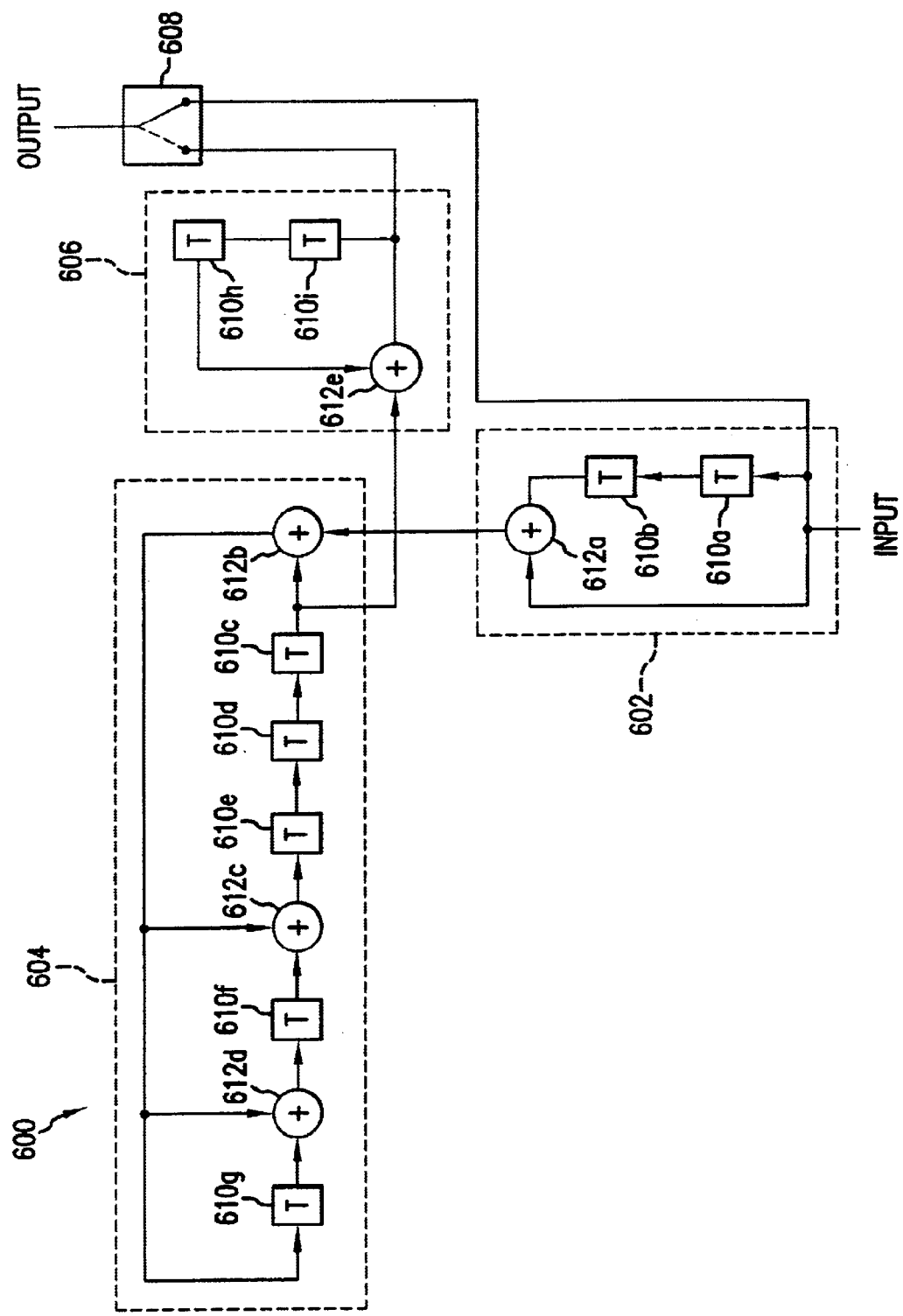
FIG. 6A is a block diagram of an example encoder according to the invention for generating a cyclic code.
Figure 6B:
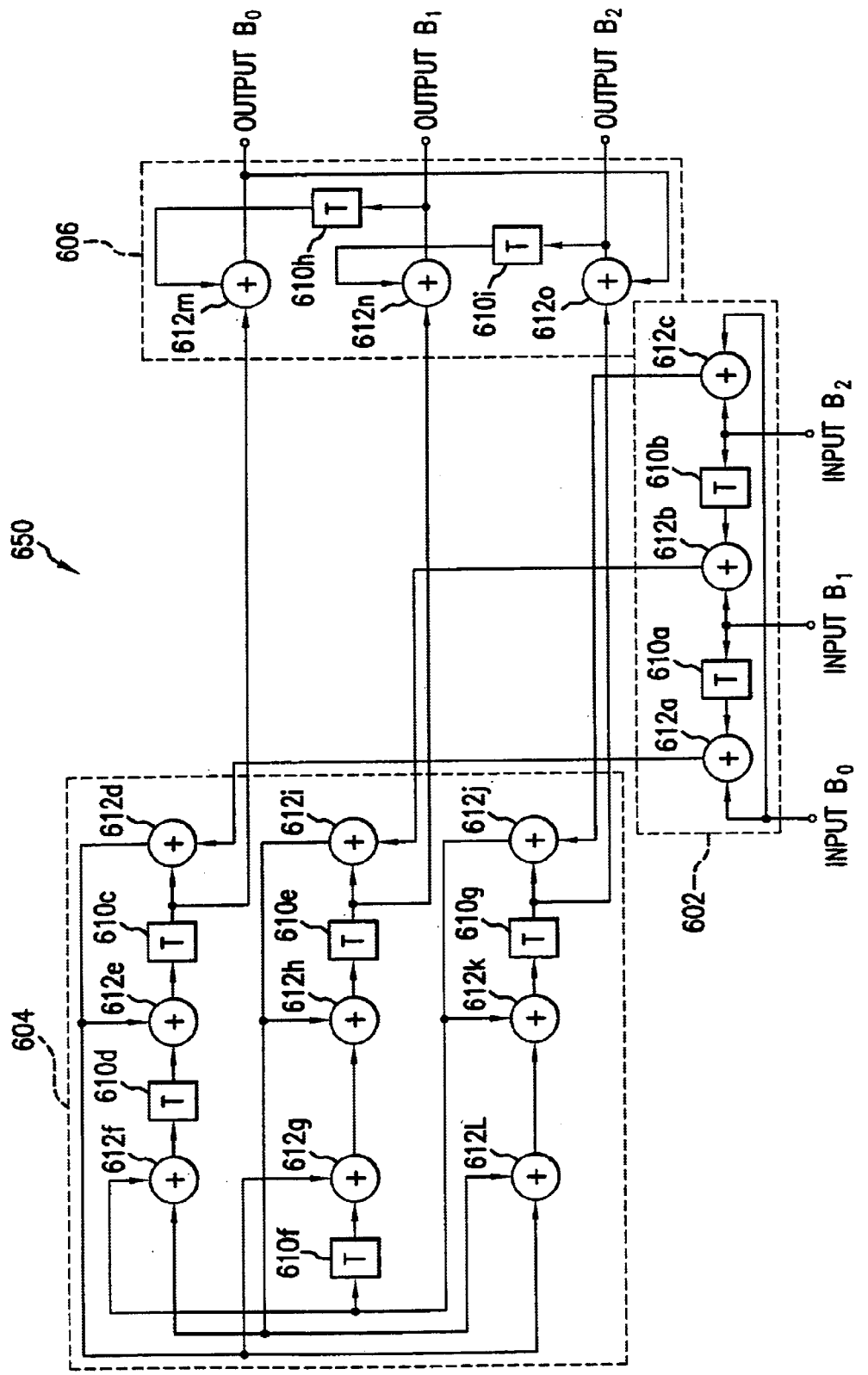
FIG. 6B is a block diagram of an example three parallel paths circuit according to the invention, which is obtained by unfolding the circuit of FIG. 6A by a factor of three.
Figure 7:
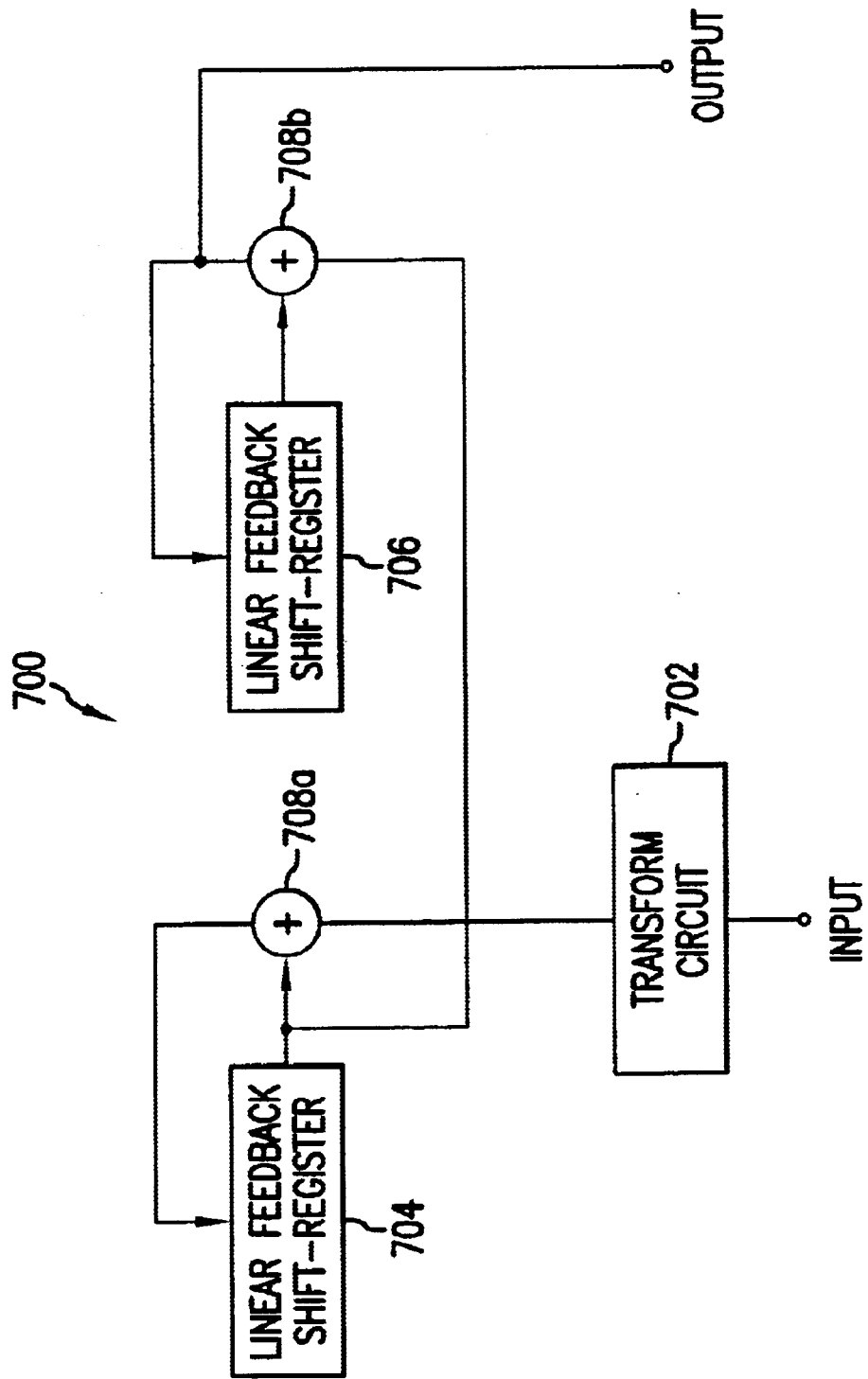
FIG. 7 is a block diagram of an example encoder according to the invention for generating a cyclic code.

As illustrated by FIG. 6A, FIG. 6B, and FIG. 7, the techniques of the present invention described above are used to form encoders for generating cyclic codes that are capable of operating at high data rates.

FIG. 6A is a block diagram of an example encoder 600 according to the invention for generating the code words of a (7, 4) CRC code. Encoder 600 includes a first transform circuit 602, a LFSR 604, a second transform circuit 606 (which is another LFSR circuit), and a switch 608. Encoder 600 is different from circuit 100 in that it includes two transform circuits in addition to the LFSR 604, and LFSR 604 implements a different generator polynomial than LFSR 104. As described above, LFSR 104 implements the generator polynomial $G(x)$ equals $(1+X+X^3)$. LFSR 604, however, implements the generator polynomial $G_2(x)$ equals $(1+X+X^2+X^5)$. $G_2(x)$ has two high-order leading-zero terms (i.e., the $X^3$ and $X^4$ terms are equal to zero). The generator polynomial $G_2(x)$ is obtained by multiplying the generator polynomial $G(x)$ equals $(1+X+X^3)$ by the polynomial $G_1(x)$ equals $(1+X)$.

As will be understood by a person skilled in the relevant arts given the description herein, transform circuit 602 adds, using modulus-2 addition, the bits of a digital input signal $U(x)$ to a copy of the digital input signal $U(x)$ delayed by two time delays. This is equivalent to multiplying the bits of the digital input signal $U(x)$ by the polynomial $G_1(x)$ equals $(1+X^2)$. Transform circuit 602 includes an adder 612a and two delay devices 610a and 610b. The output of transform circuit 602 is a transformed information signal, $T(x)$.

The devices of LFSR 604 operate in a manner similar to the devices described above with regard to LFSR 104. LFSR 604 implements a division operation and generates remained bits $R_1(x)$ at the output of a delay device 610c. These remainder bits are used to form a (7, 4) CRC code. LFSR 604 includes, in addition to delay device 610c, delay devices 610d, 610e, 610f, and 610g, and three adders 612b, 612c, and 612d. LFSR 604 divides the bits of the transformed information signal $T(x)$ by $G_2(x)$, wherein $G_2(x)$ equals $G(x)G_1(x)$. In embodiments of the invention, LFSR 604 is unfolded according to the invention to form three parallel processing paths and thereby increase the rate at which encoder 600 processes data.

Transform circuit 606 transforms the remainder bits generated by LFSR 604 into the (7, 4) CRC code words generated by circuit 100. Transform circuit 606 adds the output signal generated at the output of delay device 610c by a delayed copy of this output signal. The delayed copy of the output signal is delayed by two time delays. Transform circuit 606 is equivalent to computing the quotient obtained by dividing the remainder bits generated by LFSR 604 by the polynomial $G_1(x)$ equals $(1+X^2)$.

Switch 608 operates similarly to switch 102 of circuit 100. Switch 608 can be any conventional electronic switch such as, for example, any conventional type of field effect transistors (FET).

FIG. 6B is a block diagram of an example three parallel paths circuit 650 according to the invention. Circuit 650 is obtained by unfolding circuit 600 by a factor of three.

As shown in FIG. 6B, first transform circuit 602, LFSR 604, and second transform circuit 606 (which is another LFSR circuit) have each been unfolded in accordance with the invention. The unfolded first transform circuit 602 includes two delay devices 610 and three adders 612. The unfolded LFSR 604 includes five delay devices 610 and nine adders 612. The unfolded second transform circuit 606 includes two delay devices 610 and three adders 612.

FIG. 7 illustrates a simplified schematic of a second encoder 700 for generating a cyclic code according to an embodiment of the invention. Encoder 700 includes a transform circuit 702, a first LFSR 704, a second LFSR 706 and two modulo-2 adders 708a and 708b. The purpose of transform circuit 702 is to transform the bits of an information signal $U(x)$ into the bits of a transformed information signal $T(x)$. LFSR 704 implements a generator polynomial $G_2(x)$ formed by multiplying a conventional generator polynomial $G(x)$ for implementing a particular cyclic code by a polynomial $G_1(x)$. As described herein, the polynomial $G_1(x)$ is selected to increase the number of delays formed in the innermost nested feedback loop of LFSR 704. As described above, LFSR 704 may be unfolded/reformulated in accordance with the invention so as to avoid increasing the settling time (loop bound) of the unfolded/reformulated circuit. LFSR 706 implements a small degree polynomial used to transform the remained bits (code words) generated by LFSR 704 into the code words of a desired cyclic code (i.e., the code words that would typically be generated by the particular generator polynomial $G(x)$ that was multiplied by the polynomial $G_1(x)$). How to implement encoder 700 will become apparent to persons skilled in the relevant arts given the description of the invention herein.

Figure 8:
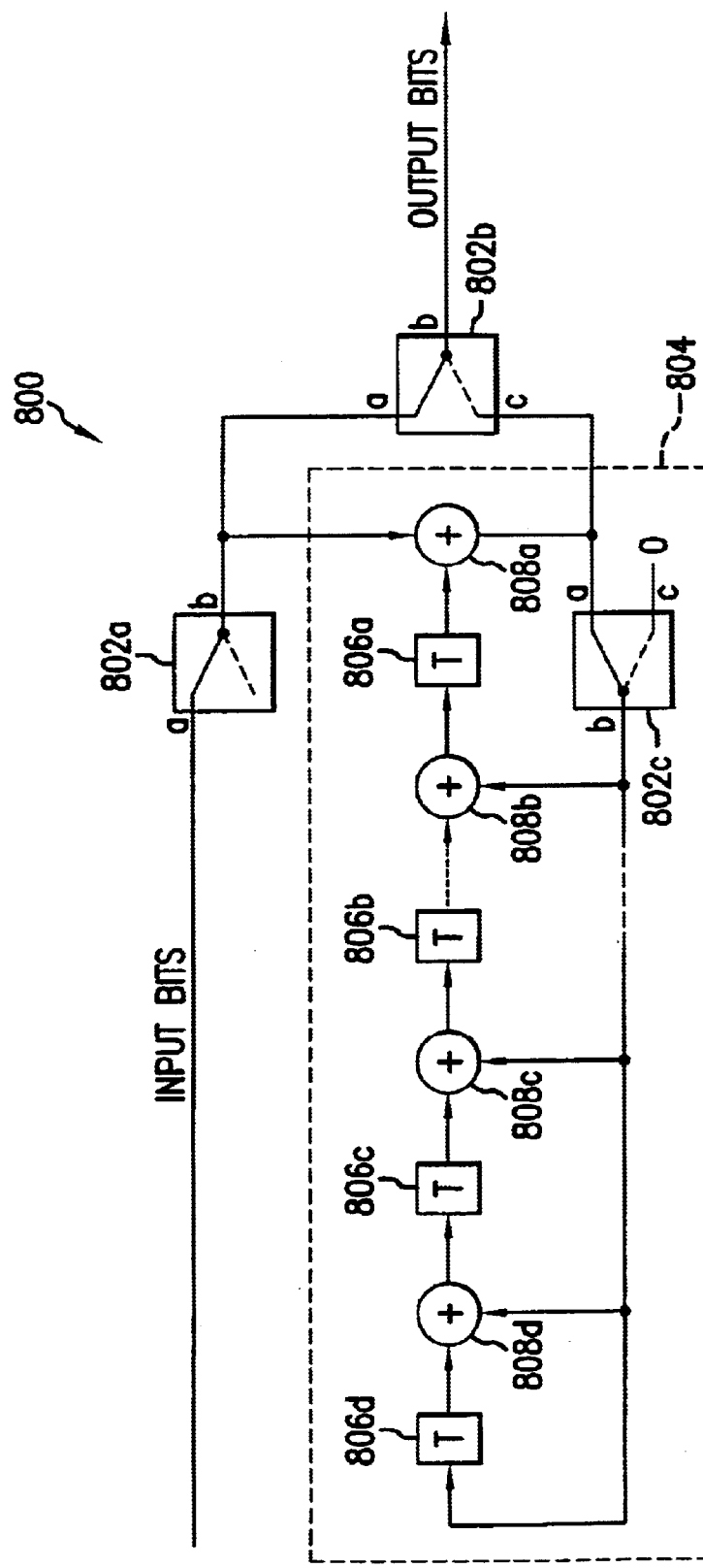
FIG. 8 is a block diagram of an example linear feedback shift-register circuit for generating a cyclic code.

FIG. 8 is a block diagram of a second example LFSR circuit 800 for generating a cyclic code. This circuit can be derived from a circuit similar to circuit 100 (see FIG. 1) by retiming. Circuit 800 is used to generate the code words of a BCH code. As described below, the operation of circuit 800 is similar to the operation of circuit 100.

FIG. 8 is provided as a second example circuit that can serve as a basis for making an encoder according to the invention. Other circuits for generating cyclic codes that can serve as a basis for making an encoder according to the invention will be known to persons skilled in the relevant arts given the description herein.

As shown in FIG. 8, circuit 800 includes three switches 802a, 802b and 802c, and an LFSR 804. LFSR 804 includes several delay devices 806 and several adders 808. Switch 802a has two ports (a and b). Switches 802b and 802c have three ports (a, b, and c). Switches 802 can be any conventional electronic switches such as, for example, any conventional type of field effect transistors (FET). Delay devices 806 can be any conventional type of delay devices such as, for example, D-flipflops. Similarly, adders 808 can be any conventional type of modulo-2 adder circuits. As can be seen in FIG. 8, LFSR 804 has several nested feedback loops. Delay device 806a forms a part of all of the nested feedback loops of LFSR 804.

Similar to circuit 100, circuit 800 has two operating modes. In a first operating mode, a BCH codeword is generated by LFSR 804. In a second operating mode, the generated BCH codeword is shifted out of LFSR 804.

In the first operating mode of circuit 800, the a-ports of switches 802a, 802b, and 802c are electrically coupled to the b-ports. As used herein, two devices or nodes of a circuit are electrically coupled if a signal at one device or node of the circuit can be sensed at another device or node of the circuit. The sensed signal may be stored, filtered, and/or amplified, for example, before being sensed at another device or node of the circuit. In this first mode, bits of a digital information signal are input to the a-port of switch 802a. During each clock cycle of circuit 800, a bit of the digital information signal is output at the b-port of switch 802b. This same bit is also provided to adder 808a. The bit provided to adder 808a is added to an output of delay device 806a to form a resultant bit. This resultant bit is then provided as an input to each of the other adders 808 (e.g., adders 808b, 808c, and 808d) of LFSR 804 and to delay device 806d of LFSR 804. How LFSR loop 804 operates to generate a BCH codeword given a group of information signal bits would be known to a person skilled in the relevant arts given the description herein. The bits of the generated codeword are the outputs of each of the delay devices 806.

In the second operating mode of circuit 800, the a-ports of switches 802a, 802b, and 802c are not electrically coupled to the b-ports. In this second mode, the c-port of switch 802b is electrically coupled to the b-port of switch 802b. Since the a-port of switch 802c is not electrically coupled to the b-port, the output of adder 808a is not fed back to any adder 808 or any delay device 806 of LFSR 804. In this second mode, during each clock cycle of circuit 800, a bit of the generated codeword is output at the b-port of switch 802b. By switching between the two modes of operation, circuit 800 generates code words and appends these code words to groups of bits of an information signal.

As described herein, the invention can be applied to circuit 800 to form a BCH encoder in a manner similar to that described above for circuit 100. A person skilled in the relevant arts given the description herein will be able to apply the invention to circuit 800 in order to make and use a BCH encoder according to the invention. In an embodiment, a BCH encoder according to the invention has the form of encoder 700 described above.

Figure 9:
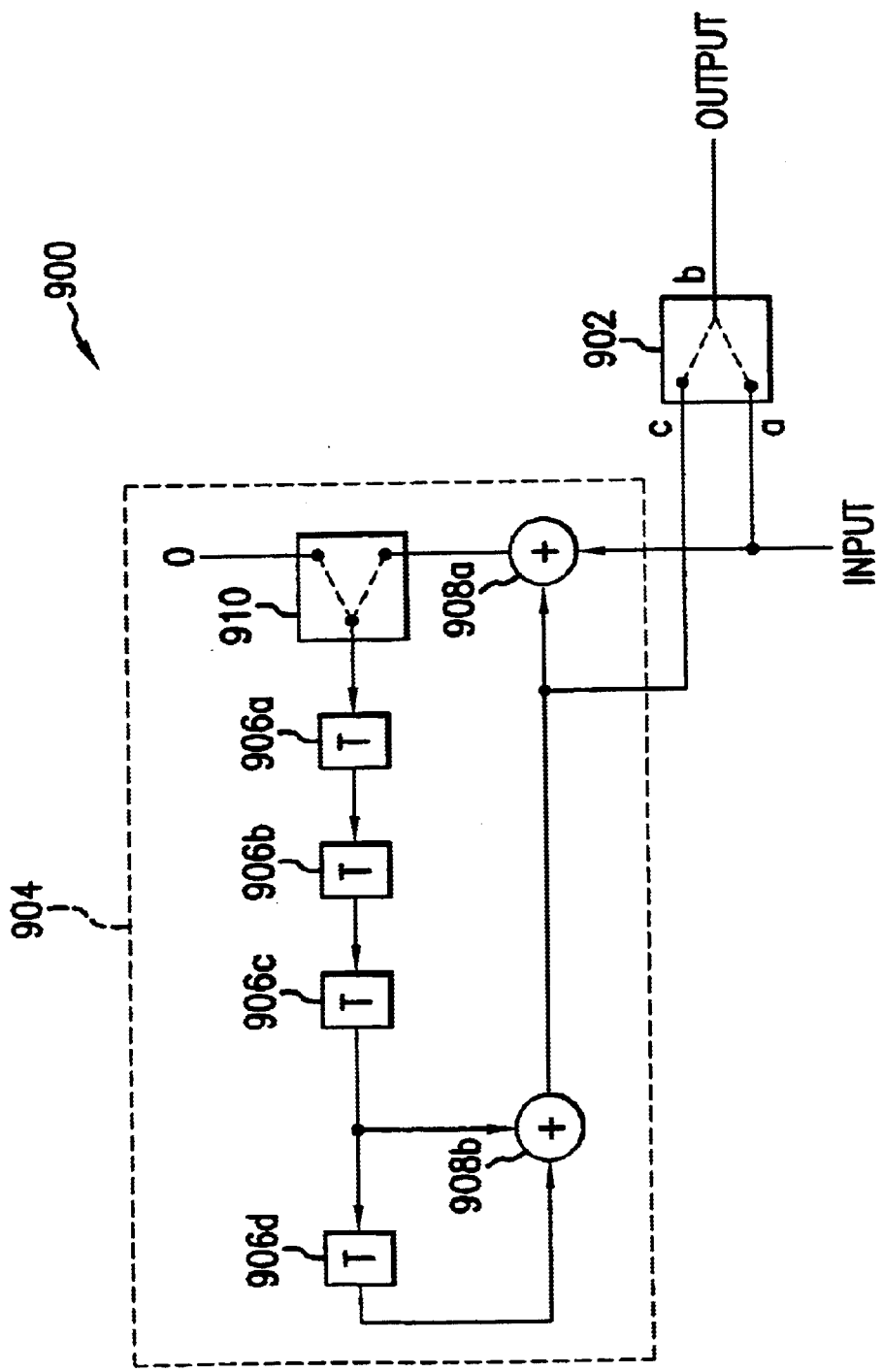
FIG. 9 is a block diagram of an example linear feedback shift-register circuit for generating a cyclic code, which is obtained by retiming the circuit of FIG. 4.
Figure 10:
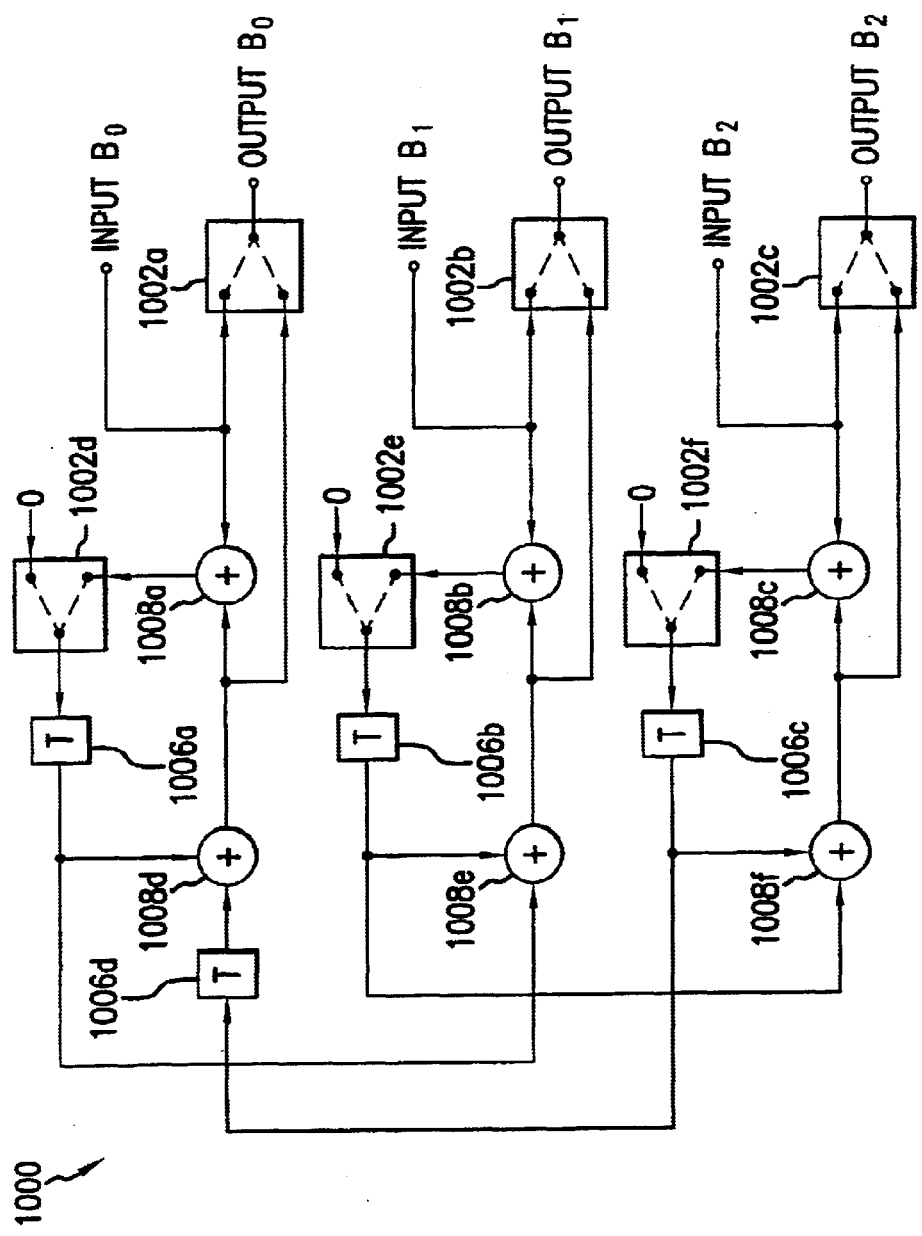
FIG. 10 is a block diagram of an example three parallel paths circuit, which is obtained by unfolding the circuit of FIG. 9 by a factor of three in accordance with the invention.

FIG. 9 and FIG. 10 illustrate how to apply the invention to retimed circuits. FIG. 9 illustrates an example embodiment of a LFSR circuit 900 that is equivalent to circuit 400 of FIG. 4. Circuit 900 is obtained by retiming circuit 400. FIG. 10 illustrates an example circuit 1000 according to the invention. Circuit 1000 is obtained by unfolding circuit 900 by a factor of three in accordance with the invention. Circuit 1000 illustrates how to apply the invention to retimed circuits such as, for example, the CRC circuits illustrated by FIG. 1 and FIG. 4.

Example Method for Generating Cyclic Codes According to the Invention

In this section, an example method for generating cyclic codes according to the invention is described. This method can be implemented using the techniques and circuit embodiments of the invention described above. The example method is not limited, however, to being implemented using only the circuits described herein.

Figure 11:
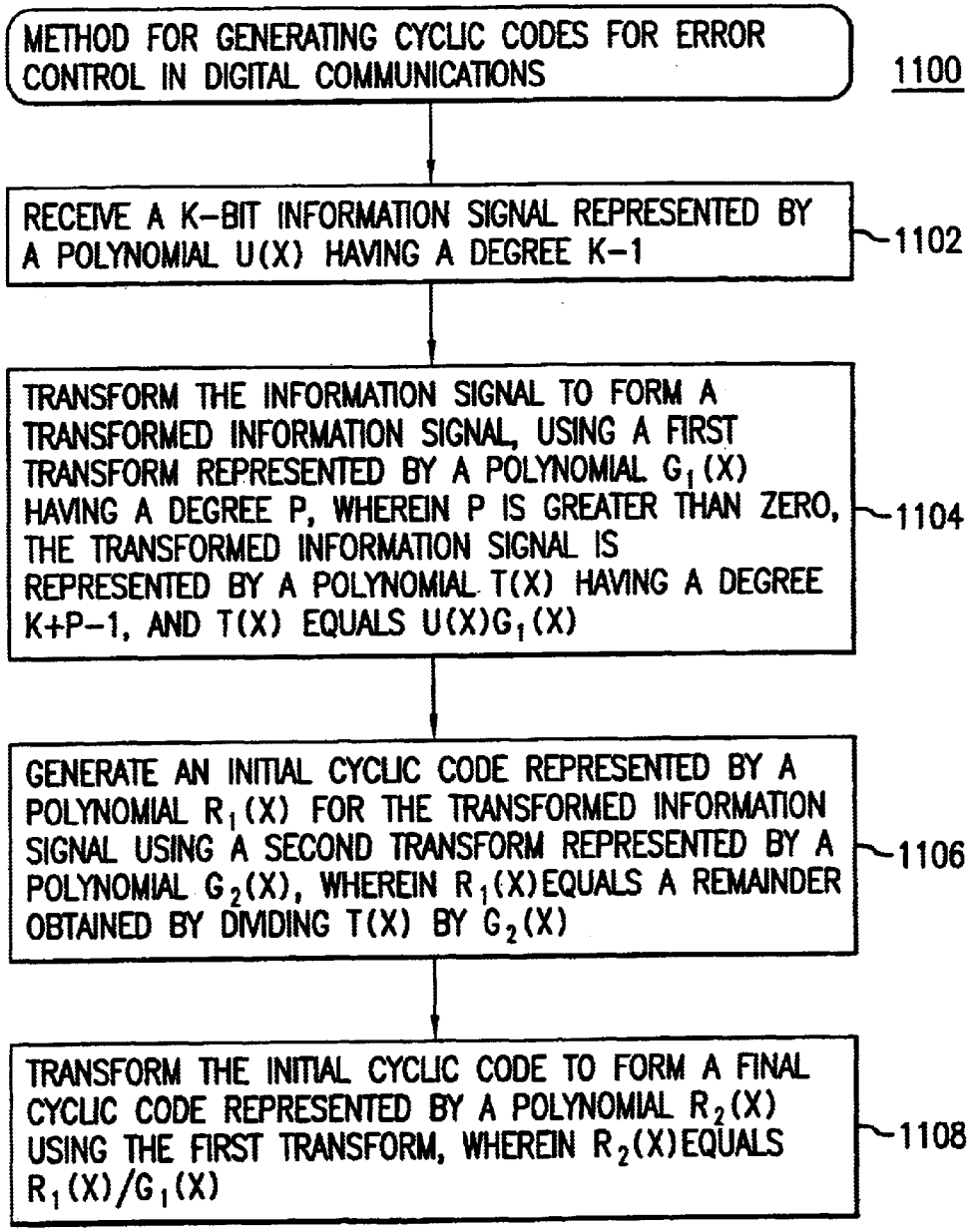
FIG. 11 is a flowchart of the steps of a method according to the invention for generating cyclic codes.

FIG. 11 is a flowchart of the steps of a method 100 for generating cyclic codes for error control in digital communications. In the example of FIG. 11, method 1100 includes four steps 1102, 1104, 1106, and 1108. Method 1100 starts with step 1102.

In step 1102, a K-bit information signal is received. This information signal is represented by a polynomial U(x) having a degree K−1.

In step 1104, the information signal U(x) is transformed to form a transformed information signal. The information signal U(x) is transformed using a first transform represented by a polynomial $G_1(x)$ having a degree P. P is greater than zero. The transformed information signal is represented by a polynomial T(x) having a degree K+P−1. T(x) equals $U(x)G_1(x)$.

In an embodiment, step 1104 involves adding the information signal U(x), using modulo-2 addition, to at least one time-shifted copy of the information signal to form the transformed information signal T(x).

In an embodiment, step 1104 can be implemented, for example, using the transform circuit 702 of circuit 700.

In step 1106, an initial cyclic code is generated for the transformed information signal T(x) using a second transform represented by a polynomial $G_2(x)$. This initial cyclic code is represented by a polynomial $R_1(x)$. $G_2(x)$ has high-order leading-zero terms. $R_1(x)$ equals the remainder obtained by dividing T(x) by $G_2(x)$.

In one embodiment, the K bits of the information signal U(x) are divided into at least two subsets of bits. These at least two subsets of bits are processed in parallel to generate the initial cyclic code $R_1(x)$.

In an embodiment, step 1106 can be implemented, for example, using the LFSR 704 of circuit 700. As described herein, in embodiments, circuit 700 is unfolded in accordance with the invention to increase the rate at which data is processed.

In step 1108, the initial cyclic code $R_1(x)$ is transformed to form a final cyclic code represented by a polynomial $R_2(x)$. The initial cyclic code $R_1(x)$ is transformed using the first transform $G_1(x)$. $R_2(x)$ equals $R_1(x)G_1(x)$.

In one embodiment, the final cyclic code formed is a cyclic redundancy check code. In another embodiment, the final cyclic code formed is a Bose-Chaudhuri-Hocquenghem code. In a further embodiment, the final cyclic code formed is a Reed-Solomon code. Other cyclic codes are also possible in accordance with the invention.

In an embodiment, step 1108 can be implemented, for example, using the LFSR 706 of circuit 700.

Given the description herein, a person skilled in the relevant arts will understand how to implement each of the steps of method 100 to generate a desired cyclic code capable of operating as a part of a high speed digital communications system.

CONCLUSION

Various embodiments of the present invention have been described above. It should be understood these embodiments have been presented by way of example only, and not limitation. It will be understood by those skilled in the relevant arts that various changes in form and details of the embodiments described above may be made without departing from the spirit and scope of the present invention as defined in the claims. Thus, the breadth and scope of the present invention should not be limited by any of the above-described exemplary embodiments, but should be defined only in accordance with the following claims and their equivalents.

What is claimed is:

1. A system for generating cyclic codes for error control in digital communications, comprising:
    a circuit that receives a K-bit information signal represented by a polynomial U(x) having a degree K−1;
    a circuit that transforms the information signal to form a transformed information signal, using a first transform represented by a polynomial $G_1(x)$ having a degree P, wherein P is greater than zero, the transformed information signal is represented by a polynomial T(x) having a degree K+P−1, and T(x) equals $U(x)G_1(x)$;
    a circuit that generates an initial cyclic code represented by a polynomial $R_1(x)$ for the transformed information signal using a second transform represented by a polynomial $G_2(x)$, wherein $R_1(x)$ equals a remainder obtained by dividing T(x) by $G_2(x)$; and
    a circuit that transforms the initial cyclic code to form a final cyclic code represented by a polynomial $R_2(x)$ using the first transform, wherein $R_1(x)$ equals $R_1(x)/G_1(x)$.

2. The system of claim 1, wherein said circuit that transforms the information signal to form the transformed information signal includes digital logic that adds the information signal to at least one time-shifted copy of the information signal.

3. The system of claim 1, wherein said circuit that generates the initial cyclic code comprises a linear feedback shift register.

4. The system of claim 1, wherein said circuit that transforms the initial cyclic code comprises a linear feedback shift register.

5. The system of claim 1, wherein the K bits of the information signal are processed in parallel to generate the initial cyclic code.

6. The system of claim 1, wherein the final cyclic code is a cyclic redundancy check code.

7. The system of claim 1, wherein the final cyclic code is a Bose-Chaudhuri-Hocquenghem code.

8. The system of claim 1, wherein the final cyclic code is a Reed-Solomon code.

9. A system for generating cyclic codes for error control in digital communications, comprising:
    means for receiving a K-bit information signal represented by a polynomial U(x) having a degree K−1;
    means for transforming the information signal to form a transformed information signal, using a first transform represented by a polynomial $G_1(x)$ having a degree P, wherein P is greater than zero, the transformed information signal is represented by a polynomial T(x) having a degree K+P−1, and T(x) equals $U(x)G_1(x)$;
    means for generating an initial cyclic code represented by a polynomial $R_1(x)$ for the transformed information signal using a second transform represented by a polynomial $G_2(x)$, wherein $R_1(x)$ equals a remainder obtained by dividing T(x) by $G_2(x)$; and
    means for transforming the initial cyclic code to form a final cyclic code represented by a polynomial $R_2(x)$ using the first transform, wherein $R_2(x)$ equals $R_1(x)/G_1(x)$.

10. The system of claim 9, wherein said means for transforming the information signal to form the transformed information signal includes means for adding the information signal to at least one time-shifted copy of the information signal.

11. The system of claim 9, wherein said means for generating the initial cyclic code comprises a linear feedback shift register.

12. The system of claim 9, wherein said means for transforming the initial cyclic code comprises a linear feedback shift register.

13. The system of claim 9, further comprising:

means for processing the K bits of the information signal in parallel to generate the initial cyclic code.

14. The system of claim 9, wherein the final cyclic code is a cyclic redundancy check code.

15. The system of claim 9, wherein the final cyclic code is a Bose-Chaudhuri-Hocquenghem code.

16. The system of claim 9, wherein the final cyclic code is a Reed-Solomon code.

17. A method for generating cyclic codes for error control in digital communications, comprising (1) receiving a K-bit information signal represented by a polynomial $U(x)$ having a degree K−1;

(2) transforming the information signal to form a transformed information signal, using a first transform represented by a polynomial $G_1(x)$ having a degree P, wherein P is greater than zero, the transformed information signal is represented by a polynomial $T(x)$ having a degree K+P−1, and $T(x)$ equals $U(x)G_1(x)$;

(3) generating an initial cyclic code represented by a polynomial $R_1(x)$ for the transformed information signal using a second transform represented by a polynomial $G_2(x)$, wherein $R_1(x)$ equals a remainder obtained by dividing $T(x)$ by $G_2(x)$; and (4) transforming the initial cyclic code to form a final cyclic code represented by a polynomial $R_2(x)$ using the first transform, wherein $R_2(x)$ equals $R_1(x)/G_1(x)$.

18. The method of claim 17, wherein step (2) comprises:

adding the information signal to at least one time-shifted copy of the information signal to form the transformed information signal.

19. The method of claim 17, wherein step (3) comprises:

dividing the K bits of the information signal into at least two subsets of bits; and processing the at least two subsets of bits in parallel to generate the initial cyclic code.

20. The method of claim 17, wherein step (4) comprises:

forming a cyclic redundancy check code.

21. The method of claim 17, wherein step (4) comprises:

forming a Bose-Chaudhuri-Hocquenghem code.

22. The method of claim 17, wherein step (4) comprises:

forming a Reed-Solomon code.

* * * * *